(12) United States Patent
Pugliese et al.

(10) Patent No.: US 6,204,444 B1
(45) Date of Patent: Mar. 20, 2001

(54) EMI SHIELDING GASKET FOR AN ELECTRONIC SYSTEM

(75) Inventors: Mark R. Pugliese, Shrewsbury; Daniel Rich, Natick; David H. Schilling, Lunenburg, all of MA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/340,565

(22) Filed: Jun. 28, 1999

(51) Int. Cl.[7] .................................................... H05K 9/00
(52) U.S. Cl. ..................... 174/35 GC; 361/816; 361/800
(58) Field of Search .................................. 361/686, 816, 361/818, 799, 800; 174/35 R, 35 GC, 52.1

(56) References Cited

U.S. PATENT DOCUMENTS

| 4,631,641 | * | 12/1986 | Brombal et al. | 361/818 |
| 5,045,635 | * | 9/1991 | Kaplo et al. | 174/35 GC |
| 5,583,750 | * | 12/1996 | Nakata et al. | 361/816 |
| 6,043,991 | * | 3/2000 | Sorrentino | 361/816 |
| 6,078,504 | * | 6/2000 | Miles | 361/727 |

* cited by examiner

Primary Examiner—Kristine Kincaid
Assistant Examiner—Hung V Ngo
(74) Attorney, Agent, or Firm—David L. Davis

(57) ABSTRACT

An electromagnetic interference shielding gasket extends through a slot in a face plate assembly bracket arm from the underside thereof. The gasket is secured to the underside of the bracket arm to avoid the problem of the gasket peeling from the bracket arm when circuit card assemblies are inserted into and removed from slots in a shelf unit.

6 Claims, 2 Drawing Sheets

EMI SHIELDING GASKET FOR AN ELECTRONIC SYSTEM

BACKGROUND OF THE INVENTION

This invention relates to the provision of electromagnetic interference shielding of an electronic system.

Modern electronic systems equipment, such as for telecommunications purposes, is often constructed as modular circuit card assemblies inserted into parallel guide slots of mechanical card cages, or shelf units, for engagement with a backplane mounted to the shelf unit at the inward ends of the guide slots. The outward edge of each circuit card of each circuit card assembly is fastened to a face plate assembly which has a latch for releasably retaining the circuit card assembly in the shelf unit. Although the circuit card assemblies are relatively closely packed, there are still gaps between adjacent face plate assemblies. These gaps allow electromagnetic interference radiation to leak therethrough. A need therefore exists to provide shielding against electromagnetic interference for such electronic systems equipment.

Each face plate assembly typically includes a conductive member, or bracket, which extends along the length of an edge of the circuit card. The bracket is commonly C-shaped with a pair of parallel arms flanking the circuit card. It is known to adhere a conductive gasket to the outwardly facing surface of one of the bracket arms, with the gasket extending sufficiently away from that arm so as to engage the other bracket arm of the circuit card assembly in the next adjacent slot in the shelf unit. However, it has been found that such gaskets tend to peel away from the bracket arm after a number of removals and insertions of a circuit card assembly from a shelf unit. Therefore, there exists a need to provide a shielding gasket which is not subject to peeling away from the bracket when the circuit card assembly is removed or inserted.

SUMMARY OF THE INVENTION

According to the present invention, one of the arms of the bracket is formed with at least one elongated slot having a major axis parallel to the edge of the circuit card. A respective conductive gasket extends through each elongated slot a sufficient distance away from a respective circuit card to engage the next adjacent bracket, and each gasket is secured to its bracket arm along that surface of the arm which faces the respective circuit card.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
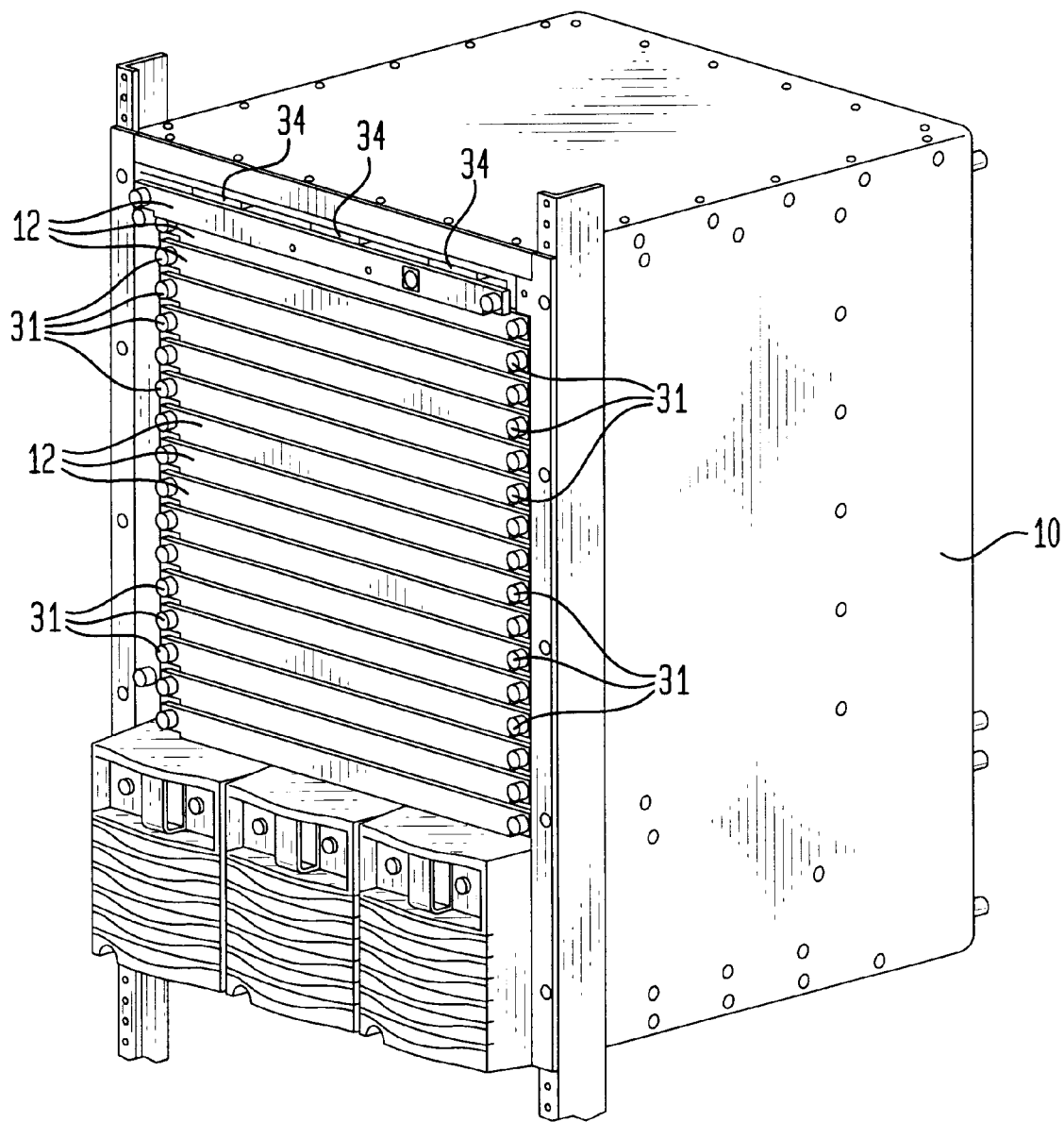
FIG. 1 is a perspective view of a shelf unit holding a plurality of circuit card assemblies protected against electromagnetic interference according to the present invention.
Figure 2:
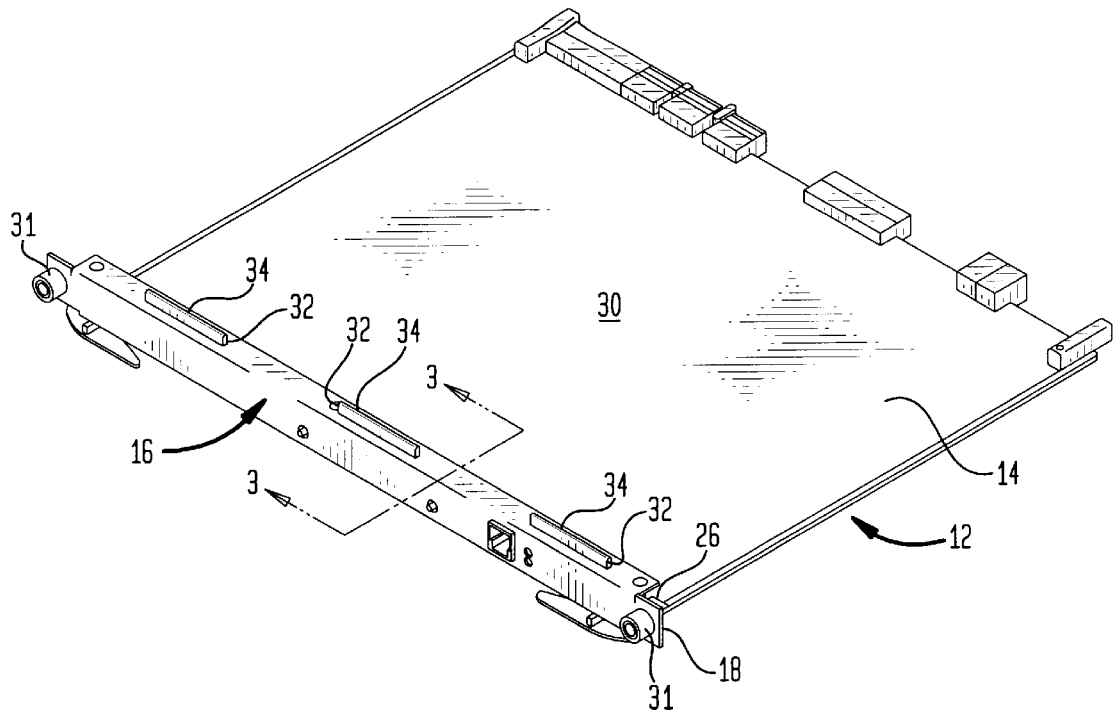
FIG. 2 is a perspective view of a circuit card assembly constructed according to this invention.
Figure 3:
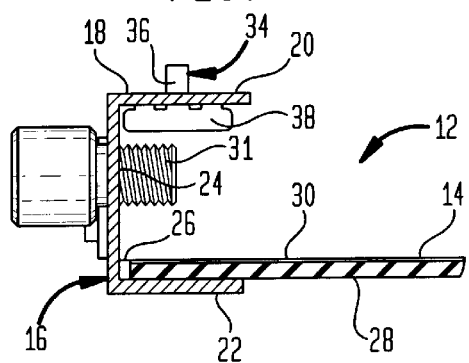
FIG. 3 is a cross-sectional view taken along the line 3–3 in FIG. 2.

FIG. 1 shows a portion of an electronic system wherein a card cage, or shelf unit, 10 holds a plurality of circuit card assemblies 12 in respective parallel slots of the shelf unit 10 so that the circuit card assemblies 12 are side by side in a parallel array. As best seen in FIGS. 2 and 3, each circuit card assembly 12 includes a circuit card 14 and a face plate assembly 16. The face plate assembly 16 includes an elongated conductive C-shaped bracket 18 having a pair of spaced parallel arms 20, 22 and a transverse spine 24 connecting the arms 20, 22. The circuit card 14 and the bracket 18 are secured one to the other so that an edge 26 of the circuit card 14 is adjacent to the bracket spine 24 and the bracket arms 20, 22 flank the circuit card 14, with the arm 22 being adjacent to a first side 28 of the circuit card 14 and the arm 20 being spaced from the second side 30 of the circuit card 14. Each face plate assembly 16 includes a pair of headed screws 31 for securing the respective circuit card assembly 14 to the shelf unit 10.

According to the present invention, the bracket 18 is formed with at least one elongated slot 32 in its arm 20. The slot 32 has its major axis parallel to the circuit card edge 26. Illustratively, the slots 32 are co-linear, approximately two inches long and are spaced approximately three inches apart. Each slot 32 holds a respective conductive gasket 34.

Figure 4:
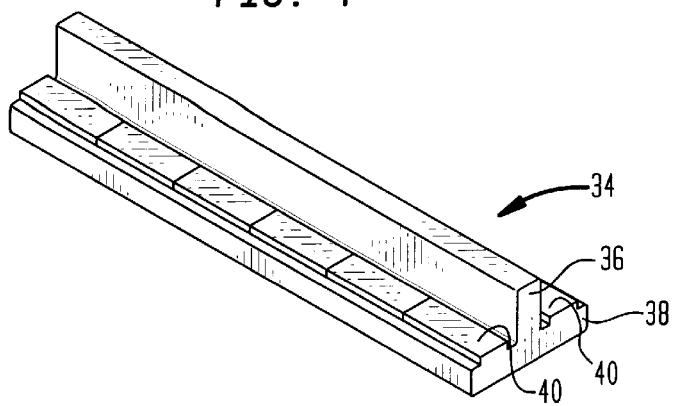
FIG. 4 is a perspective view of a conductive gasket constructed according to the present invention.

As best shown in FIG. 4, the gasket 34 is generally T-shaped with a stem portion 36 extending through a respective slot 32 and a cross bar portion 38 extending orthogonally away from the stem portion 36 and having a surface 40 adapted to be secured to the underside of the bracket arm 20. For such securement, a layer of pressure sensitive adhesive may be applied to the surface 40 of the cross bar portion 38 on both sides of the stem portion 36.

The gasket 34 is illustratively formed of vapor metallized foam material, such as that manufactured by Schlegel Systems, Inc. of Rochester, New York, but other conductive resilient gaskets may be utilized.

The gasket stem portion 36 extends through the slot 32 and away from the bracket arm 20 a sufficient distance so that it engages the bracket arm 22 of a face plate assembly held in the next adjacent slot of the shelf unit 10. By securing the gasket 34 to the underside of the bracket arm 20, the problem is eliminated of the gasket 34 peeling away from the bracket arm 20 when the circuit card assembly 12 is inserted or removed from the shelf unit 10.

While the described embodiment has shown three slots 32 spaced approximately three inches apart, it is understood that the spacing between gaskets 34 is related to the frequency of operation of the electronic equipment, with higher frequencies requiring smaller gaps between adjacent gaskets 34.

Further, while the described embodiment has shown the inventive arrangement in association with circuit card assemblies, it will be appreciated that the inventive arrangement can also be used on doors, panels or any removable/serviceable component having parallel flanges which closes off an aperture.

Accordingly, there has been disclosed an improved shielding gasket for an electronic system. While an illustrative embodiment of the present invention has been disclosed herein, it is understood that various adaptations and modifications to the disclosed embodiment are possible and it is intended that this invention be limited only by the scope of the appended claims.

What is claimed is:

1. In an electronic system having a shelf unit adapted to hold in respective parallel slots a plurality of circuit card assemblies side by side in a parallel array, wherein each circuit card assembly includes a circuit card and a face plate assembly, wherein each face plate assembly includes an elongated conductive C-shaped bracket having a pair of spaced parallel arms and a transverse spine connecting the pair of arms, and wherein the bracket is mounted to the circuit card so that an edge of the circuit card is adjacent to the transverse spine, a first of said arms is adjacent to a first side of the circuit card and a second of said arms is spaced from the second side of the circuit card, the improvement comprising:

each bracket second arm is formed with at least one elongated slot having a major axis parallel to the circuit card edge;

a respective conductive gasket extends through each elongated slot at a sufficient distance away from the respective circuit card to engage the first arm of the face plate assembly held in a next adjacent one of the slots of the shelf unit; and each gasket is secured to the bracket second arm along that surface of the bracket second arm which faces the respective circuit card.

2. The improvement according to claim 1 wherein each gasket comprises a first gasket portion extending through the respective elongated slot and a second gasket portion extending orthogonally away from the first gasket portion and having a surface adapted to be secured to the respective bracket second arm.

3. The improvement according to claim 2 wherein each gasket is T-shaped with the second gasket portion being the cross bar of the T.

4. The improvement according to claim 1 wherein each bracket second arm has at least two elongated slots and the elongated slots on each bracket second arm are co-linear, approximately two inches long and spaced approximately three inches apart.

5. The improvement according to claim 1 wherein each gasket is formed of vapor metallized foam material.

6. In an electronic system having an enclosure with an aperture adapted to be closed by at least two components, wherein the periphery of the aperture lies substantially in a plane, wherein each component is associated with and mounted to a respective elongated conductive C-shaped bracket having a pair of spaced parallel arms and a transverse spine connecting the pair of arms, and wherein the transverse spine lies parallel to the plane and the bracket arms cross the plane when the respective component and associated bracket is mounted in the enclosure, the improvement comprising:

each bracket second arm is formed with at least one elongated slot having a major axis which is parallel to the plane;

a respective conductive gasket extends through each elongated slot at a sufficient distance away from the bracket second arm to engage a bracket first arm of a next adjacent component mounted in the enclosure; and each gasket is secured to the bracket second arm along that surface of the bracket second arm which faces the respective bracket first arm.

* * * * *